(12) United States Patent  
McFadden et al.

(10) Patent No.: US 6,873,031 B2  
(45) Date of Patent: Mar. 29, 2005

(54) SHIELDING DEVICE USED FOR VARIOUS COMPONENTS MOUNTED ON CIRCUIT BOARD ALIGNED WITH SELECTIVELY CUT AREAS

(75) Inventors: Jeff McFadden, Blairstown, NJ (US); Michael Lambert, Randolph, NJ (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 10/469,812

(22) PCT Filed: Mar. 4, 2002

(86) PCT No.: PCT/US02/06280

§ 371 (c)(1),  
(2), (4) Date: Mar. 22, 2004

(87) PCT Pub. No.: WO02/071484

PCT Pub. Date: Sep. 12, 2002

(65) Prior Publication Data

US 2004/0155308 A1 Aug. 12, 2004

Related U.S. Application Data

(60) Provisional application No. 60/273,314, filed on Mar. 2, 2001.

(51) Int. Cl.[7] .......................... H01L 23/552; H05K 7/14  
(52) U.S. Cl. ...................... 257/659; 257/660; 361/800; 361/816; 361/818

(58) Field of Search ................................. 257/659, 660, 257/294; 361/800, 816, 818; 174/35 R, 35 GC

(56) References Cited

U.S. PATENT DOCUMENTS 5,576,710 A * 11/1996 Broderick et al. ............. 342/1  
5,758,401 A * 6/1998 Nelson ......................... 29/460  
6,248,393 B1 * 6/2001 Bunyan et al. ............... 427/77

* cited by examiner

Primary Examiner—David Nelms  
Assistant Examiner—Long Tran  
(74) Attorney, Agent, or Firm—Pitney Hardin LLP

(57) ABSTRACT

A shielding device is provided in which a layer of deformable electrically conductive material is conformed to fit over the components on the board. In one embodiment of the invention the deformable material is conductive foam, such as metalized foam. One or both sides of the foam layer can be covered with dielectric material. Portions of the dielectric material and foam can be removed, such as from the bottom layer to create insulating slants over the components. Cuts in the deformable material lead to compression only over the component. The board can be placed over the components, which are received in recesses in the shield which are either preformed or result from compression of the deformable material at the location of the components. In one embodiment of the invention, regions of conductive layer are removed and the layer is placed over the components. A top layer is placed thereover. The invention also relates to the method of foaming the board level shield.

7 Claims, 5 Drawing Sheets

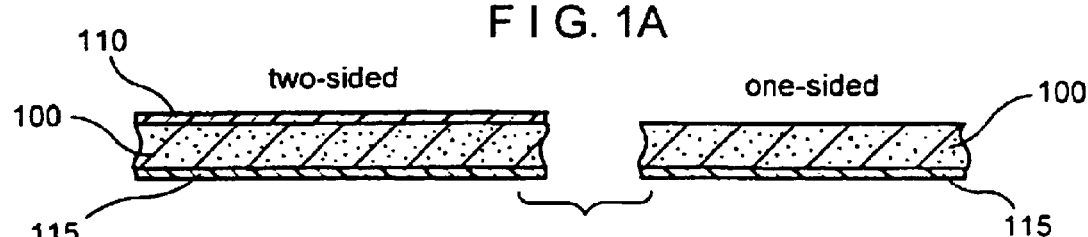
FIG. 1A
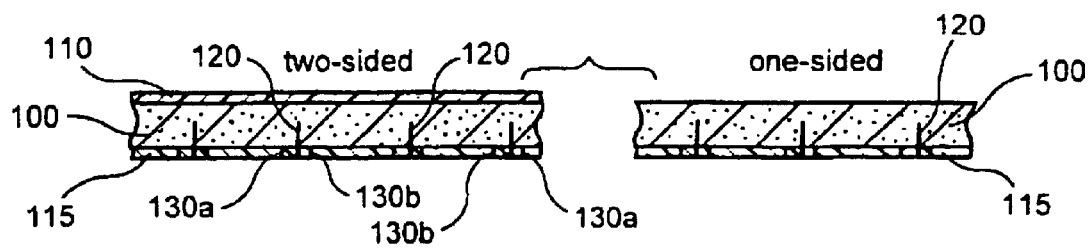
FIG. 1B
FIG. 1C
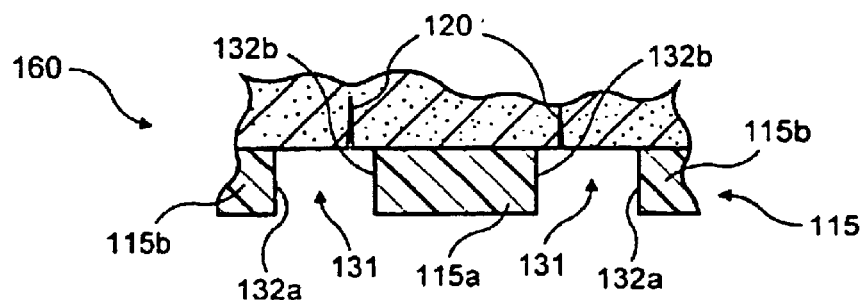
FIG. 1D
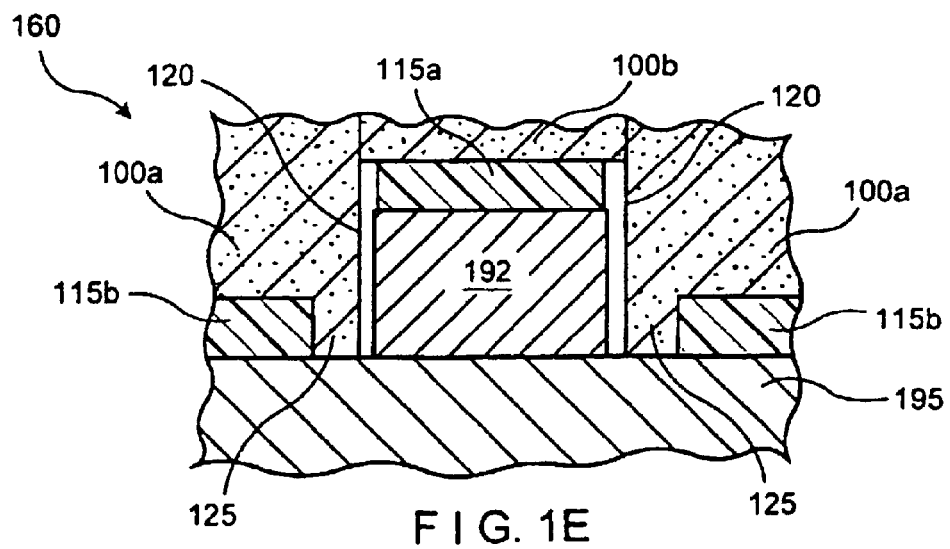
FIG. 1E

SHIELDING DEVICE USED FOR VARIOUS COMPONENTS MOUNTED ON CIRCUIT BOARD ALIGNED WITH SELECTIVELY CUT AREAS

This application claims the benefits of prov. application 60/273,314 filed on Mar. 2, 2001.

BACKGROUND OF THE INVENTION

The invention relates generally to electromagnetic force (EMI) shielding materials and more particularly, to a shield for various components mounted on a circuit board.

Many electrical components generate EMI and other noise in operation and various electrical components are sensitive to EMI generated elsewhere. Accordingly, it is often advantageous to shield an electrical component to prevent it from emitting EMI or to shield an electrical component from EMI emitted elsewhere.

Many electrical devices include electrical components arranged on a circuit board. One way that such components have been shielded is to mount five sided metal cans over each individual component. The cans can all be grounded. Often, this is done by soldering the can to a ground line. It is necessary to remove the cans in the event any of the components need to be serviced, which can be inconvenient.

Conventional shielding products have proved to be not fully satisfactory, both in terms of cost and convenience of use. Accordingly, it is desirable to provide an improved board level shield which is less expensive and easier to assemble and remove than conventional shielding devices.

SUMMARY OF THE INVENTION

Generally speaking, in accordance with the invention, a shielding device is provided in which a layer of deformable electrically conductive material is conformed to fit over the components on the board. In one embodiment of the invention the deformable material is conductive foam, such as metalized foam. One or both sides of the foam layer can be covered with dielectric material. Portions of the dielectric material and foam can be removed, such as from the bottom layer to create insulating islands over the components. Cuts in the deformable material lead to compression only over the components. The board can be placed over the components, which are received in recesses in the shield, which are either preformed or result from compression of the deformable material at the location of the components. In one embodiment of the invention, a conductive sheet is taller than the electrical components and openings are formed through the sheet with dimensions slightly greater than those of the components. This sheet is placed over the board and the components are received in the openings. A second conductive sheet is then placed thereover. The invention also relates to the method of forming the board level shield.

Accordingly, an object of the invention is to provide an improved shield for electrical components.

Another object of the invention is to provide an improved method of forming an EMI shield for electrical components.

Still other objects and advantages of the invention will in part be obvious and more in part be apparent in the specification and drawings.

The invention accordingly comprises the several steps and the relation of one or more of such steps with respect to each of the others and the article embodying features of construction and arrangements of parts, which are exemplified in the following detailed disclosure.

BRIEF DESCRIPTION OF THE DRAWINGS

For a fuller understanding of the invention, reference is had to the following description, taken in connection with the accompanying drawings, in which:

FIG. 1A is a cross sectional view of a compressible conductive sheet for a shielding member in accordance with a preferred embodiment of the invention;

FIG. 1B is a cross sectional view of a the conductive sheet of FIG. 1A, with a dielectric layer on the top and bottom surfaces thereof;

FIG. 1C is a cross sectional view of the composite of FIG. 1B, with partial die cuts in the lower dielectric layer and the lower portion of the conductive sheet;

FIG. 1D is an enlarged partial cross sectional view of the composite of FIG. 1C, with portions of the lower dielectric layer removed to form insulating islands on the bottom of the conductive sheet;

FIG. 1E is a partial cross sectional view of the shield of FIG. 1D installed over electrical components mounted on a circuit board with the islands resting on the top of electrical components and the foam over the islands in a compressed state;

DETAILED DESCRIPTION OF THE PREFERRED EMBODIMENTS

Figure 2:
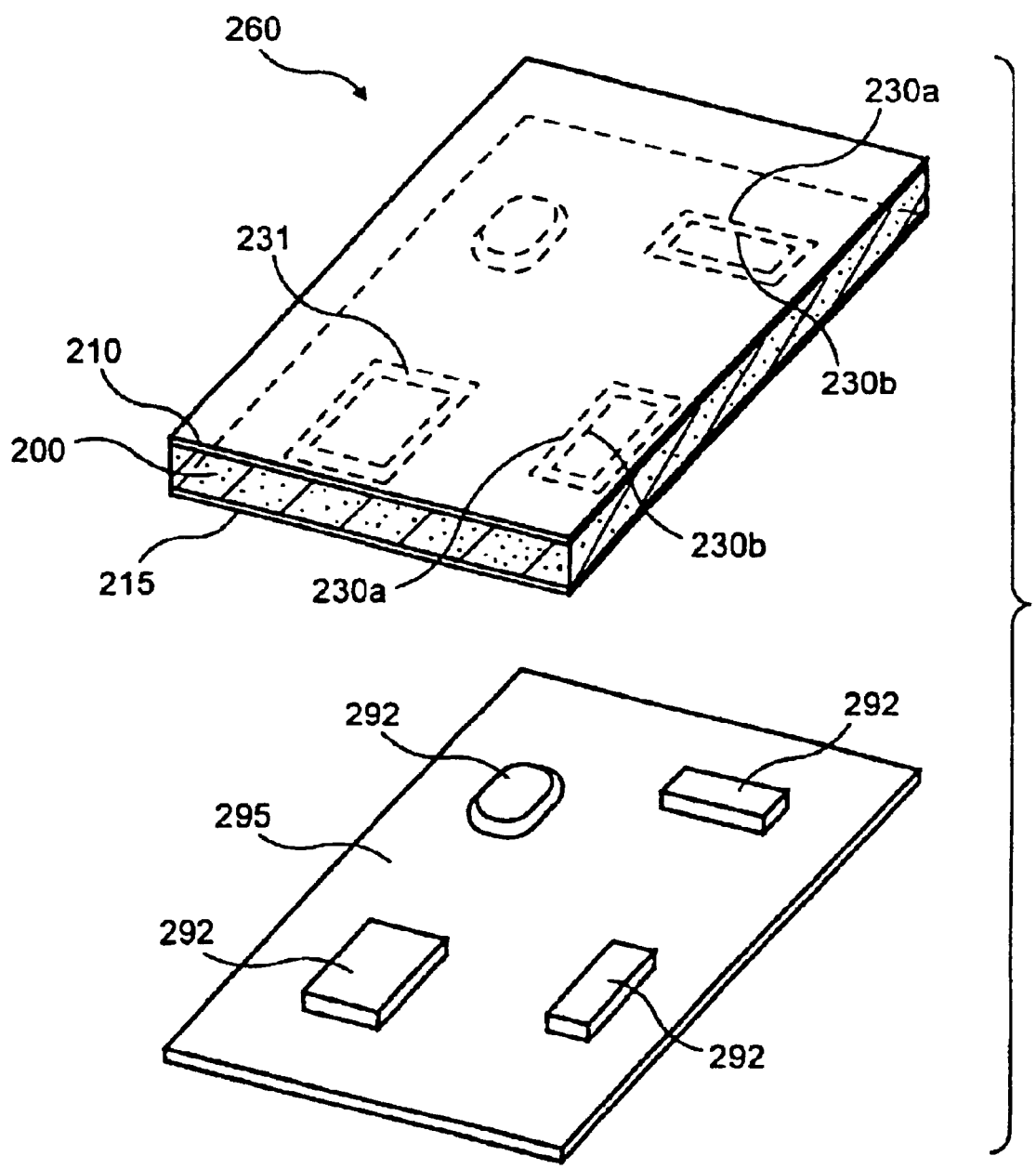
FIG. 2 is a perspective view of a board level shield in accordance with the invention, positioned above a circuit board having an electrical components mounted thereon.

Preferred embodiments of the invention employ a multi-layer laminate material as a board level shield. A sheet of conductive foam, such as metalized foam or other conductive compressible material can be covered on its top and bottom, or merely its bottom or top, or not at all, with a layer of insulating (dielectric) material. In a preferred embodiment of the invention, a layer of insulating material is at least on the bottom surface of the conductive sheet.

In one embodiment of the invention, the bottom of the shield is selectively die cut to remove portions of the lower dielectric layer and expose portions of the conductive foam around islands of insulating material. The shield is then pressed over components on a circuit board and portions of the metalized foam contact conductive lines on the board at the edges of the components to serve as a connection to ground. Portions of the insulating layer on the bottom surface of the foam layer can be selectively removed to facilitate such contact. Partial die cuts can also be provided in the foam to facilitate localized compression of the foam in the areas above the electrical components only.

As one exemplary non-limiting embodiment of the invention, reference is had to a conductive (e.g. metalized) foam layer 100 in FIG. 1A. In FIG. 1B, an upper dielectric layer 110 and a lower dielectric layer 115 are shown disposed on the top and bottom surfaces of conductive foam layer 100. The actual order of assembly is immaterial and the conductive foam can be disposed over a first dielectric layer and the second dielectric layer formed thereon or the dielectric layers can be disposed on opposite sides of the conductive foam layer 100. Use of one layer is also acceptable.

Referring to FIG. 1C, it can be seen that a series of die cuts 130a–130d are made through insulating layer 115 and that an additional series of die cuts 120 are made into the body of conductive foam layer 100. The die cuts in the foam layer are advantageously made in between pairs of die cuts in the insulating layer, such as between cuts 130a and 130b.

Referring to FIG. 1D, it is seen that portions of the insulating layer between die cuts 130a and 130b are removed, to form an open area 131 as defined by a pair of walls 132a and 132b to form a modified dielectric layer 115', which is comprised of a series of dielectric segments 115a, bounded by open spaces. In preferred embodiments of the invention, segments 115a are rectangular islands bounded by a continuous rectangular open area 131. The result is a board level shield 160 which can be disposed over electrical components 192 arranged on a circuit board 195, as shown in FIG. 1E.

Referring to FIG. 1E, it can be seen that when dielectric island portion 115a contacts the top of electrical component 192, this causes a portion of conductive foam layer 100b, bounded by die cut 120 to be compressed above electrical component 192. Depending on the relative dimensions of dielectric portion 115a to electrical component 192, shield 160 can be formed so that portion of conductive foam layer 100 contacts either a top or side of electrical component 192 or is prevented from contacting electric component 192. Because conductive foam layer 100 includes cuts 120 a portion of form layer 100a will not be compressed as a result of layer 100 contacting electrical component 192 and will contact the upper surface of circuit board 195. Because portions of insulating layer 115 were removed in void areas 131 a trace portion 125 can be urged past the height of insulating layer 115b and contact circuit board 195. It should be noted that the relative heights, widths and thicknesses of portions of shield 160 and the electrical components are not drawn to scale, for purposes of illustration.

In general, conductive foam layer 100 can be about 0.03–0.05 inches thick and insulating layer 115 can be about 1 to 5 mils thick. Insulating layer 110 and 115 can be formed of various materials, such as polycarbonate, polypropylene, PC/ABS, polyethylene and mylar. Cuts 120a and 120b should be about 0.005 to 0.125 inches from the edge of electrical component 192 and traces 125a and 125b should be about 0.01 to 0.125 inches wide.

Referring to FIG. 2, a shield 260 is shown in accordance with an embodiment of the invention. Shield 260 includes a lower insulated layer 215, a middle conductive metalized foam sheet 200 thereover and a top insulated layer 210 on foam sheet 200. Shield 260 has portions of bottom insulated layer 215 removed at cuts 230a and 230b, for the removal of a rectangular void 231, where there is no lower dielectric layer 215.

Figure 3A:
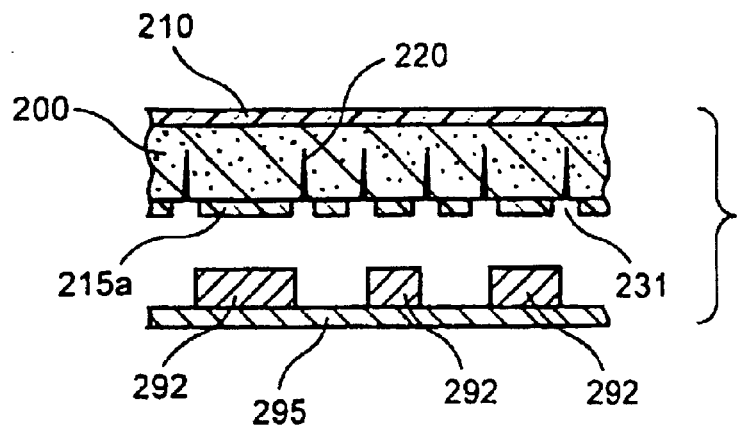
FIG. 3A is a cross sectional view of a board level shield in accordance with preferred embodiments of the invention positioned over a circuit board having electrical components mounted thereon in the unassembled condition.
Figure 3B:
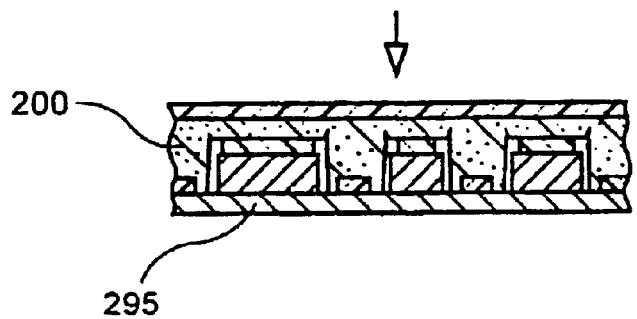
FIG. 3B is cross sectional view of the shield and board of FIG. 3A, in the assembled condition.
Figure 3C:
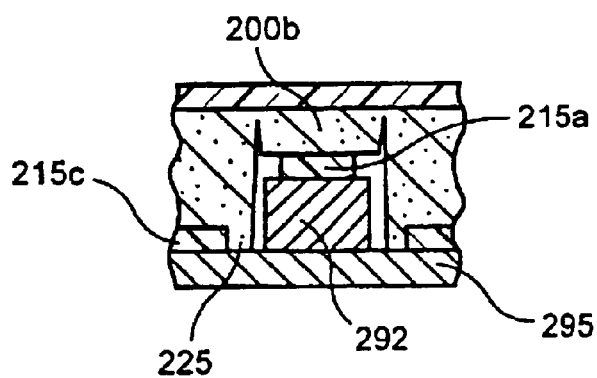
FIG. 3C is an enlarged partial cross sectional view of the assembly of FIG. 3B.

Referring to FIG. 3A, it can be seen that shield 260 is positioned over circuit board 295 and then assembled. As shown in FIGS. 3A and 3B, insulating portion 215a will contact the top of component 292. This will cause a portion 200b of foam layer 200 to be compressed over component 292. In addition, because foam layer 200 includes die cuts 220 that are spaced apart from island 215a, trace portions 225 of foam layer 200 will come in contact with circuit board 295.

In other embodiments of the invention, die cuts 120 can be formed in the same operation and line up with die cuts 130b. Likewise, die cuts 220 can be formed at the same time as and line up with die cuts 230b.

Figure 4:
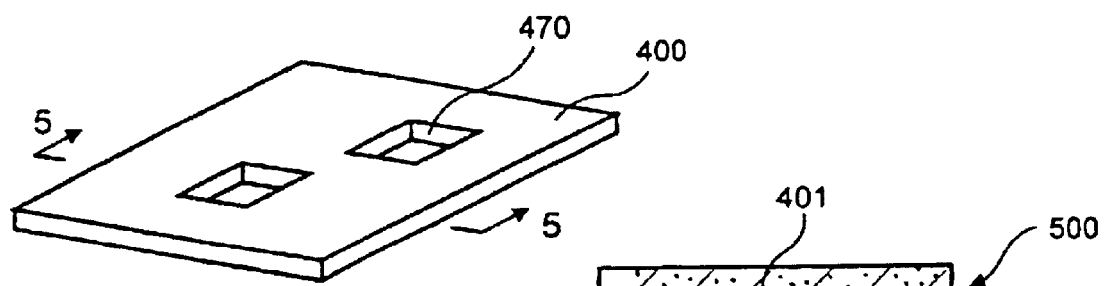
FIG. 4 is a perspective view of a conductive sheet for a board level which in accordance with the invention.
Figure 5:
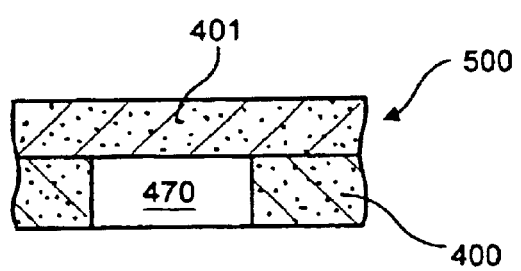
FIG. 5 is a cross sectional view along line 5—5 of the sheet of FIG. 4, with a second sheet placed thereover.

In still another embodiment of the invention, as shown in FIGS. 4 and 5, a shield 500 can be formed with two insulating foam layers, a first lower foam layer 400 having openings 470 cut therein to fit over electrical components on a circuit board and a second foam layer 401 which is disposed over foam layer 400. The bottom of lower foam layer 400 can include an insulating surface over its entirety or regions of the dielectric surface can exposed portions of foam layer 400 for contacting the circuit board. The top surface of upper foam layer 401 can include an insulating surface. In certain embodiments of the invention, upper layer 401 can be bonded and selected portions to foam layer 400 or otherwise fastened thereto with electrically conductive or non-conductive joining mechanisms.

In each of these embodiments of the invention, it can be advantageous to mount a structure, such as a plastic cover, metal cover or circuit board over the shield to hold and compress it in place.

Figure 6:
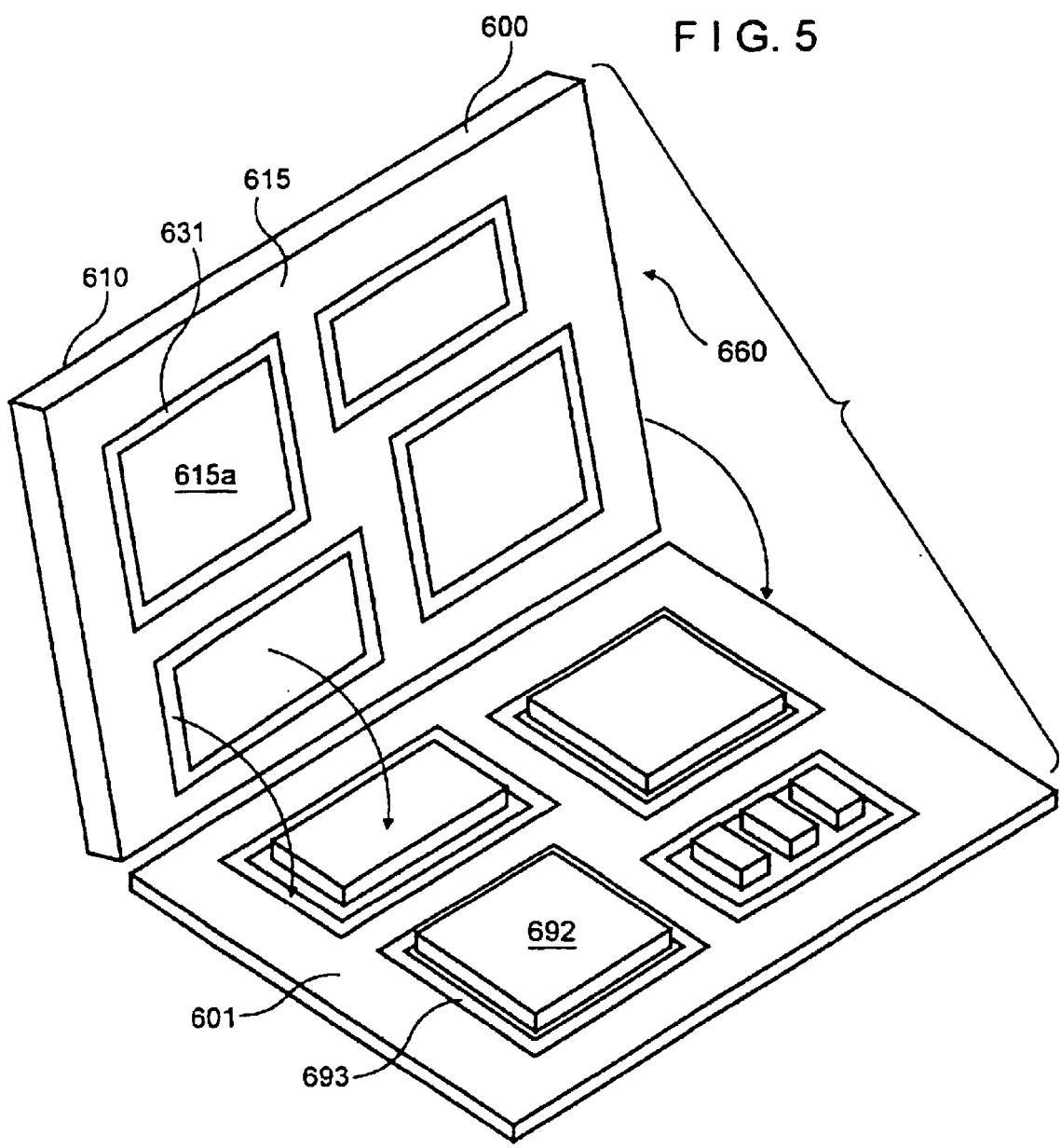
FIG. 6 is a perspective view of a circuit board having electrical components mounted thereon and a shield for fitting over the board.

FIG. 6 shows a perspective view of a circuit board 601 having a plurality of electrical component 692 mounted thereon. A ground trace 693 is disposed around each component 692. FIG. 6 also shows a board shield 660 having a layer of metalized foam 600 with a lower dielectric layer 615 and an upper dielectric layer 610 on its respective lower and upper sides.

Figure 7A:
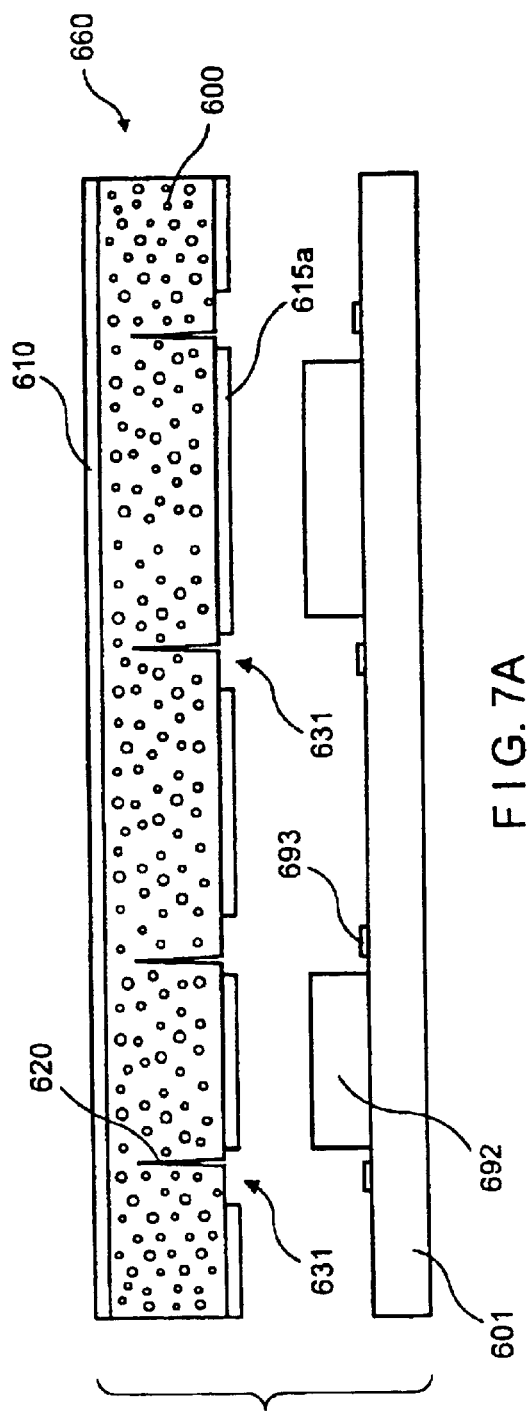
FIG. 7A is a partial cross sectional view of the board and shield of FIG. 6, in the unassembled condition.
Figure 7B:
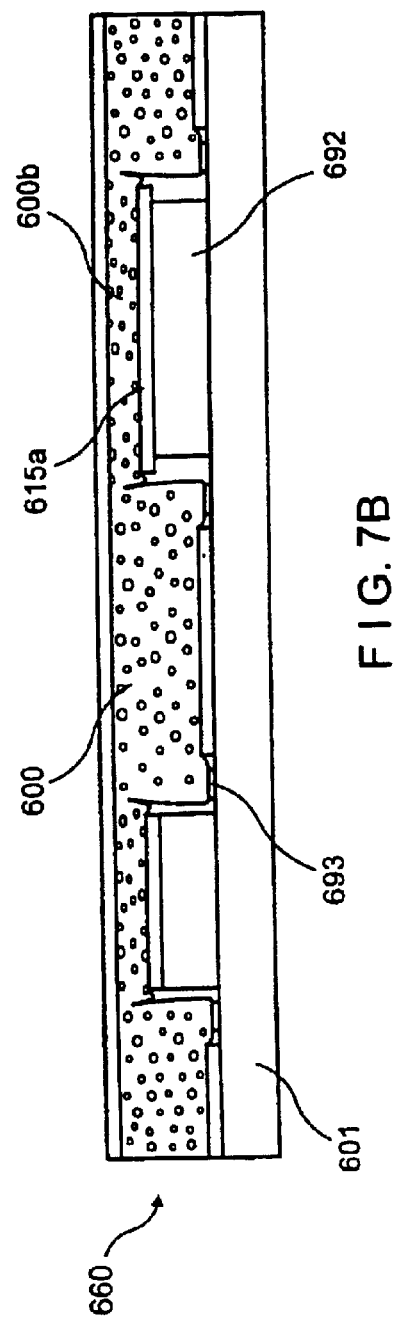
FIG. 7B is a partial cross sectional view of the board and shield of FIG. 6, in the assembled condition.

Referring to FIGS. 7A and 7B, it can be seen that open areas 631 were formed where portions of dielectric layer 615 surrounding a plurality of insulating layer islands 615a were removed from lower dielectric layer 615. Islands 615a align with the tops of components 692. Referring to FIG. 7B, which shows board 601 and shield 660 in the assembled condition, regions of compressed foam 600b exist above each component 692. Such localized compression is facilitated as a result of partial die cuts 620 formed around each of the areas where the electrical components 692 are positioned. It can also be seen that portions of exposed conductive foam 600 will contact ground traces 693 when shield 660 is compressed towards board 601.

As is evident from the exemplary embodiments discussed and shown in the Figures, one aspect of the invention is a board level EMI shield, in which a conductive sheet includes die kiss cuts in the general shape of the electrical components arranged in a circuit board, so that when the sheet is placed over the components, the components will compress the foam bounded by the die cuts and the remainder of the foam will extend to the surface of the board, to effectively shield each of the components on the board. In preferred embodiments of the invention, shield includes insulating material, such as various dielectric materials, within the boundaries defined by the die cuts, to rest on the top surface of the electrical component and space the conductive foam from the component. In other embodiments of the invention, the shield comprises two layers of conductive material, such as conductive foam material. Voids are formed in the lower of the two layers where the electrical components can be housed, either in contact with or spaced apart the conductive material. A second layer is then disposed over the first to provide an effective shield.

A preferred method of making a shield in accordance with the preferred embodiments of the invention is to provide a conductive foam sheet and coat, such as by spraying or dipping insulating material on the bottom, top or both the bottom and top thereof or by laminating a dielectric layer to the foam with flame laminating techniques or adhesive bonding. The insulating material is removed to form islands of insulating material bordered by voids, with the reconductive material exposed. Cuts are made in the conductive sheet, in the void region and then when the board is placed over the components on the circuit board, the islands separate the foam from the components and the die cuts permit the foam to be compressed over the components and uncompressed in areas between the components, so that the foam can reach the surface of the circuit board. Alternatively, one or both of the cuts into the insulating layer can extend into the conductive sheet to promote selective compression of the conductive material over the electrical components.

Thus the several aforementioned objects and advantages are most effectively attained. Although preferred embodiments of the invention have been disclosed and described in detail herein, it should be understood that this invention is in no sense limited thereby and its scope is to be determined by that of the appended claims.

What is claimed is:

1. A shielding device comprising:
   a layer of foam with a first side and a second side;
   a first layer of dielectric material on said first side of said layer of foam, said layer of dielectric material including selectively cut areas;
   said layer of foam including cuts perpendicular to said layer of dielectric material, formed proximate to perimeters of said selectively cut areas;
   wherein electronic components can be shielded by being aligned with said selectively cut areas and the shielding device can be urged against the electronic components whereby portions of said layers of foam defined by said cuts compress.

2. The shielding device of claim 1 wherein said selectively cut areas of said dielectric material include islands formed from said first layer of dielectric material.

3. The shielding device of claim 2 further including a second layer of dielectric material on said second side of said foam.

4. The shielding device of claim 3 wherein said layer of foam is conductive.

5. The shielding device of claim 4 wherein said layer of foam is metalized.

6. The shielding device of claim 5 wherein gaps are formed between said first layer of dielectric material and said islands.

7. The shielding device of claim 6 wherein shapes and positions of said islands are chosen to correspond to shapes and positions of electronic components.

* * * * *